(12) United States Patent
Funakoshi

(10) Patent No.: US 7,485,960 B2
(45) Date of Patent: Feb. 3, 2009

(54) SEMICONDUCTOR DEVICE AND MANUFACTURING METHOD THEREOF

(75) Inventor: Masashi Funakoshi, Osaka (JP)

(73) Assignee: Panasonic Corporation, Osaka (JP)

( * ) Notice: Subject to any disclaimer, the term of this patent is extended or adjusted under 35 U.S.C. 154(b) by 28 days.

(21) Appl. No.: 11/543,153

(22) Filed: Oct. 5, 2006

(65) Prior Publication Data

US 2007/0096314 A1    May 3, 2007

(30) Foreign Application Priority Data

Nov. 2, 2005    (JP)    ............... 2005-318933

(51) Int. Cl.
  *H01L 23/52*  (2006.01)
  *H01L 21/00*  (2006.01)
(52) U.S. Cl. ............... 257/737; 257/383; 257/E23.069; 257/E21.505; 438/113; 438/118; 438/460
(58) Field of Classification Search ................. 257/737, 257/782, 783, E23.609, E21.505; 438/113, 438/118, 460, 462
See application file for complete search history.

(56) References Cited

U.S. PATENT DOCUMENTS

| | | | | |
|---|---|---|---|---|
| 6,762,488 B2* | 7/2004 | Maeda et al. | ............... | 257/686 |
| 6,877,992 B2* | 4/2005 | Grant et al. | ............... | 439/66 |
| 6,992,380 B2* | 1/2006 | Masumoto | ............... | 257/709 |
| 2002/0084522 A1* | 7/2002 | Yoshizawa et al. | ............... | 257/692 |
| 2005/0067722 A1* | 3/2005 | Koike | ............... | 257/797 |
| 2006/0226529 A1* | 10/2006 | Kato et al. | ............... | 257/686 |

FOREIGN PATENT DOCUMENTS

JP    64-332    1/1989

* cited by examiner

*Primary Examiner*—Tuan N. Quach
(74) *Attorney, Agent, or Firm*—Steptoe & Johnson LLP

(57) ABSTRACT

A semiconductor device of the invention includes a semiconductor element (1), an interposer (5) having electrodes (2) arranged on a top face thereof in four directions and external electrodes (4) arranged on a bottom face thereof with the semiconductor element (1) mounted on the top face thereof, an adhesive material (6) fixing the semiconductor element (1) to the interposer (5), metal nanowires (7) electrically connecting between electrodes of the semiconductor element (1) and the electrodes (2) of the interposer (5), an insulating material (8) sealing a region containing the semiconductor element (1) and the metal nanowires (7), and metal balls (9) mounted on the external electrodes (4). Patterns (10) are designed on corners of a region surrounded by electrodes (2) arranged on the interposer (5) in four directions.

6 Claims, 5 Drawing Sheets

PRIOR ART

SEMICONDUCTOR DEVICE AND MANUFACTURING METHOD THEREOF

BACKGROUND OF THE INVENTION (1) Field of the Invention

The present invention relates to a ball grid array semiconductor device where a terminal arrangement is an area array, and a manufacturing method thereof.

(2) Description of the Related Art

Recently, with respect to electronic equipment, particularly, portable equipment, there are increasing demands for multifunction, high performance, space saving, and low cost. In response to this trend, a semiconductor element having multiple pins arranged thereon at a fine pitch and having a shrunk chip size becomes popular.

Consequently, development of a package including the semiconductor element having the aforementioned features so as to satisfy the aforementioned demands becomes urgent. As for development of a package, a pitch between terminals is made finer by a multipin-type QFP; thus, space saving is achieved.

However, in order to achieve still further space saving, there is developed a ball grid array package (hereinafter, simply referred to as "BGA") where an arrangement of terminals TS1 is an area array as illustrated in FIG. 7 (refer to, e.g., Japanese Unexamined Utility Model Publication No. 1-332). As a result, there is an increasing demand for the BGA.

Size reduction by space saving is especially required for such a BGA. As one of methods for realizing size reduction, electrodes connected to metal nanowires of an interposer are arranged at a fine pitch.

However, if the electrodes are arranged at a fine pitch, a wire bonding apparatus is degraded in accuracy of recognizing the electrodes. As a result, there is a possibility that positional deviation upon bonding occurs. In order to avoid this disadvantage, as illustrated in FIG. 8, recognition patterns NP1 having a specific shape different from that of an electrode are arranged at corners of an interposer IP1 having electrodes arranged thereon in four directions in order to improve recognition accuracy; thus, positional deviation upon bonding is prevented.

However, this conventional technique has the following problems.

In future, still further cost reduction is required for a BGA; therefore, it is important to design an interposer such that semiconductor devices to be obtained from one substrate 17 illustrated in FIG. 7 are increased in number. In order to increase semiconductor devices to be obtained from one substrate 17 in number, it is indispensable that an interposer is effectively arranged to eliminate a wasteful space from which no semiconductor device is obtained.

Consequently, a dimension of a recognition pattern 18 arranged at the wasteful space from which no semiconductor device is obtained must be decreased. In addition, as a BGA is reduced in outer dimension, a corner space for electrodes arranged on an interposer in four directions becomes narrow, so that a recognition pattern is reduced in size.

A wire bonding apparatus fails to recognize such a recognition pattern having a reduced size, so that positional deviation upon bonding occurs. This means that electrodes of an interposer cannot be arranged at a fine pitch, leading to hindrance to size reduction of a semiconductor device.

In a die bonding process, the recognition patterns NP1 are used as recognition marks for alignment. Therefore, if recognition accuracy is degraded due to small recognition marks, accuracy of mounting a semiconductor element on a substrate is also degraded. This means that a distance between a side face of a semiconductor element and an electrode of an interposer cannot be made short, leading to hindrance to size reduction of a semiconductor device.

SUMMARY OF THE INVENTION

The present invention is made to solve the aforementioned problems. An object of the present invention is to provide a semiconductor device and a manufacturing method thereof each producing the following effects. That is, a semiconductor device can be reduced in size. Semiconductor devices obtained from one substrate can be increased in number as a substrate design. A semiconductor device can be manufactured at low cost. Accuracy of mounting a semiconductor element on an interposer can be improved. Positional deviation of wire bonding can be prevented with reliability.

In order to achieve the aforementioned object, the present invention provides a semiconductor device comprising: a semiconductor element having a plurality of electrodes; an interposer having electrodes arranged on a top face thereof in four directions and external electrodes arranged on a bottom face thereof with the semiconductor element mounted on the top face thereof; an adhesive material fixing the semiconductor element to the top face of the interposer; metal nanowires electrically connecting between the plurality of electrodes of the semiconductor element and the electrodes arranged in four directions of the interposer; an insulating material sealing a region containing the semiconductor element and the metal nanowires; and metal balls mounted on the external electrodes of the interposer, wherein at least a pair of patterns, different in shape from the electrodes arranged in four directions, are designed on diagonal corners of a region surrounded by the electrodes arranged on the interposer in four directions.

With this configuration, the pattern is allowed to have a dimension such that a die bonding apparatus and a wire bonding apparatus sufficiently recognize the pattern, without depending on a substrate region from which no semiconductor device is obtained. Further, the pattern is designed near the semiconductor element mounted on the interposer. Therefore, even when amount position of the semiconductor element is deviated to some extent, verification of a distance between the pattern and a side face of the semiconductor element makes it possible to immediately correct positional deviation of the semiconductor element.

Thus, it is possible to maintain or improve accuracy of mounting the semiconductor element on the interposer. As a result, it is possible to embody a semiconductor device further reduced in size. In addition, the recognition pattern is designed on a substrate region for a semiconductor device. Therefore, it is possible to increase, in number, semiconductor devices to be obtained from one substrate as much as possible irrespective of the region having the recognition pattern designed thereon. Thus, it is possible to manufacture a semiconductor device at low cost.

In the semiconductor device according to the present invention, the patterns designed on the diagonal corners of the region surrounded by the electrodes arranged on the interposer in four directions are formed in an "L" shape, respectively.

With this configuration, a recognizing apparatus can readily distinguish the pattern from the electrode. Further, lines are drawn in X and Y directions; thus, positional deviation of a semiconductor element can be identified quickly, and a distance between a side face of the semiconductor element and the pattern can be measured readily. As a result, the positional deviation can be corrected with good accuracy.

In the semiconductor device according to the present invention, the patterns designed on the diagonal corners of the region surrounded by the electrodes arranged on the interposer in four directions have a ground function and are electrically connected to the semiconductor element through the metal nanowires, respectively.

With this configuration, it is unnecessary to separately arrange wires each having a ground function on the interposer.

Conventionally, plugs connecting wires led out from electrodes to each other in each layer are arranged in a region surrounded by electrodes arranged in four directions. However, according to the present invention, there is no arrangement of wires each having a ground function. Thus, it is possible to improve the degree of freedom in designing of a plug arrangement.

In the semiconductor device according to the present invention, the patterns designed on the diagonal corners of the region surrounded by the electrodes arranged on the interposer in four directions are electrically connected to electrodes, each having a signal function, of the semiconductor element through the metal nanowires.

With this configuration, a distance from the semiconductor element to the pattern is shorter than a distance from the semiconductor element to the electrodes of the interposer; therefore, the metal nanowires connecting between the electrodes of the semiconductor element and the pattern can be made shorter in length. Of signal functions, in particular, a signal having a high frequency and requiring a high-speed signal or a signal having noise to be decreased is effectively connected to the pattern.

In the semiconductor device according to the present invention, the patterns designed on the diagonal corners of the region surrounded by the electrodes arranged on the interposer in four directions function as lands connected to plugs connecting between wires led out from the electrodes arranged on the interposer in four directions and wires in each layer.

With this configuration, the patterns designed on the diagonal corners of the region surrounded by the electrodes arranged on the interposer in four directions function as lands connected to plugs for connecting wires in each layer to each other. Thus, the pattern serves as a recognition pattern and, also, serves as a portion where the wires lead out from the electrodes of the interposer are lead in. Thus, patterns functioning as only lands are reduced in number. As a result, it is possible to increase the degree of freedom in wiring design of a region surrounded by electrodes arranged in four directions.

The present invention also provides a manufacturing method of a semiconductor device, comprising the steps of: mounting a semiconductor element having a plurality of electrodes on a top face of an interposer having electrodes arranged on the top face thereof in four directions and external electrodes arranged on a bottom face thereof; electrically connecting between the plurality of electrodes of the semiconductor element and the electrodes arranged in four directions of the interposer, through metal nanowires; sealing a region containing the semiconductor element and the metal nanowires with an insulating material; mounting metal balls on the external electrodes of the interposer; and dicing, for each semiconductor element, the interposer into semiconductor devices in a state that the semiconductor element is mounted on the top face of the interposer, wherein in the step of mounting the semiconductor element on the interposer, patterns designed on diagonal corners of a region surrounded by the electrodes arranged on the interposer in four directions are used as a recognition mark for recognizing a position on the interposer and used for alignment.

With this configuration, the patterns are used as a substrate recognition mark, respectively. As a result, recognition accuracy is improved because the pattern has such a dimension that a recognizing apparatus readily recognizes the pattern, so that a position of the semiconductor element to be mounted on the interposer becomes stable. Further, a facility can be prevented from being halted due to erroneous recognition, leading to improvement in productivity.

According to the present invention, as described above, it is possible to improve accuracy of mounting a semiconductor element on an interposer, to prevent positional deviation upon wire bonding, and to reduce a wasteful space, from which no semiconductor device is obtained, on an interposer.

Thus, it is possible to realize size reduction of a semiconductor device, to increase, in number, semiconductor devices to be obtained from one substrate as a substrate design, to manufacture a semiconductor device at low cost, to improve accuracy of mounting a semiconductor element on an interposer, and to prevent positional deviation upon wire bonding with reliability.

DESCRIPTION OF THE PREFERRED EMBODIMENTS

Hereinafter, specific description will be given of a semiconductor device and a manufacturing method thereof according to the present invention with reference to the drawings.

First Embodiment

First, description will be given of a semiconductor device according to a first embodiment of the present invention.

Figure 1A:
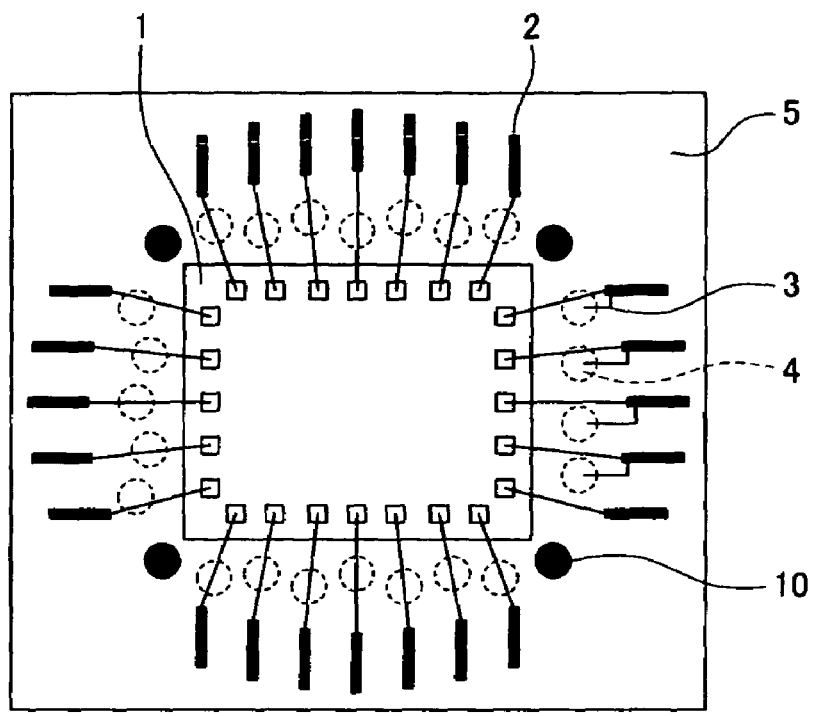
FIG. 1A is a plan view illustrating a structure of a semiconductor device according to a first embodiment of the present invention.
Figure 1B:
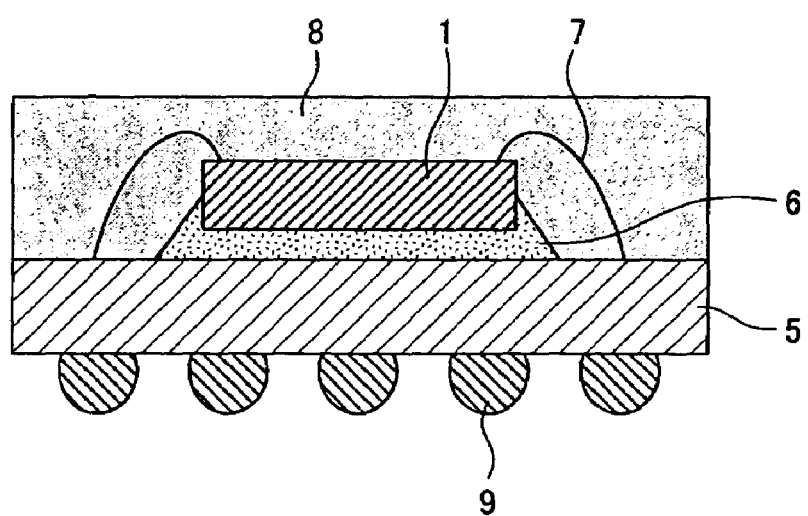
FIG. 1B is a sectional view illustrating the structure of the semiconductor device according to the first embodiment of the present invention.

FIGS. 1A and 1B illustrate a structure of the semiconductor device according to the first embodiment. Specifically, FIG. 1A is a plan view of the semiconductor device, and FIG. 1B is a sectional view of the semiconductor device. As illustrated in FIGS. 1A and 1B, the semiconductor device includes a semiconductor element 1, electrodes 2, wires 3 led out from electrodes (FIG. 1A illustrates only one side; actually, lead wires are designed on four sides), lands 4 connected to the wires 3 led out from the electrodes and, also, connected to plugs each connecting wires in each layer to each other, an interposer 5 having the semiconductor element 1 mounted thereon, an adhesive material 6 fixing the semiconductor element 1 to the interposer 5, metal nanowires 7 electrically connecting between the electrodes of the semiconductor element 1 and the electrodes 2 of the interposer 5, an insulating material 8 sealing a region containing the semiconductor element 1 and the metal nanowires 7, and metal balls 9 mounted on external terminals of the interposer 5. The semiconductor device according to the first embodiment has a feature in that peculiar patterns 10 are designed as a recognition pattern on corners of a region surrounded by the electrodes 2 arranged on the interposer 5 in four directions.

Figure 7:
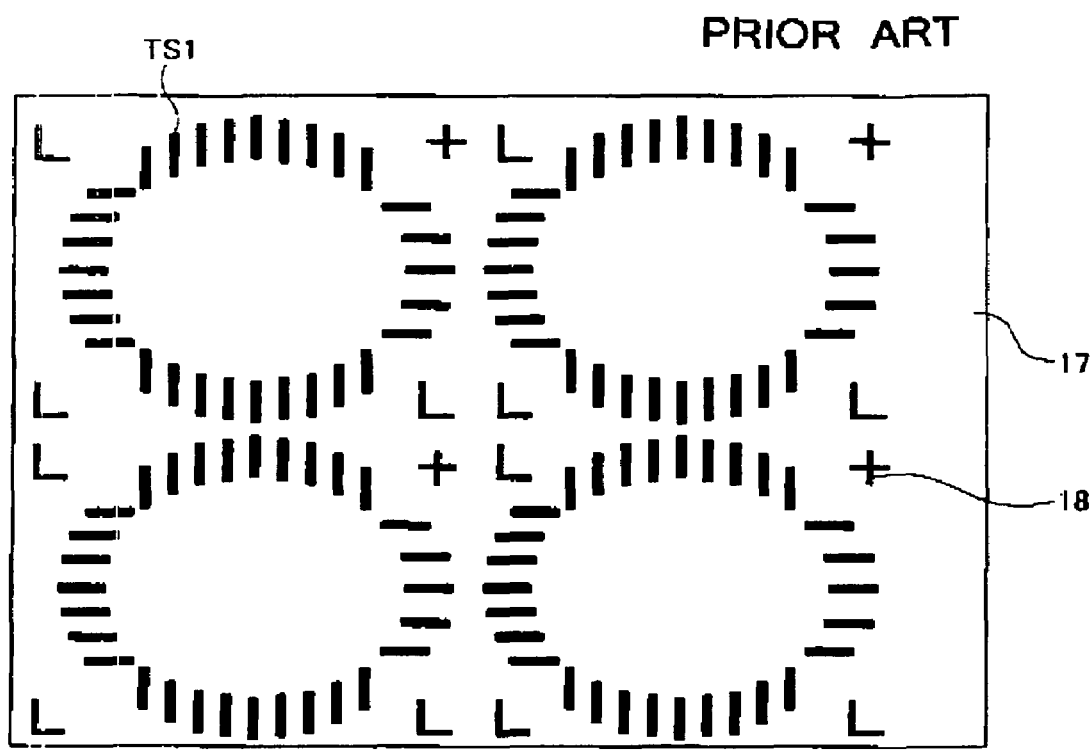
FIG. 7 illustrates a pattern layout on a substrate upon designing of a conventional semiconductor device.
Figure 8:
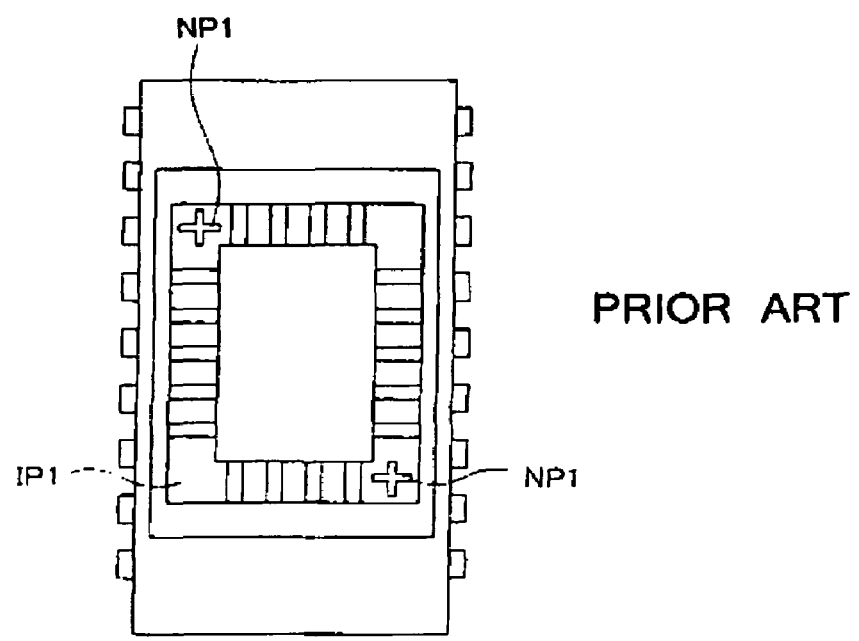
FIG. 8 illustrates a structure of the conventional semiconductor device.

In a conventional pattern layout on a single substrate, as illustrated in FIG. 7, a plurality of (four in FIG. 7) electrode patterns of semiconductor devices are designed on a single substrate 17, and recognition patterns 18 are designed outside pattern regions of the semiconductor devices. In this case, when an area other than the pattern regions of the semiconductor devices is reduced, the recognition pattern 18 must be reduced in dimension. Consequently, it is difficult for a wire bonding apparatus to recognize the recognition pattern 18, resulting in positional deviation upon bonding.

On the other hand, according to the first embodiment, as illustrated in FIG. 1A, the recognition patterns 10 are designed on the four corners of the region surrounded by the electrodes 2 arranged on the interposer 5 in four directions. Thus, the recognition pattern 10 is allowed to have a dimension such that a die bonding apparatus and a wire bonding apparatus sufficiently recognize the recognition pattern 10, without depending on a size of a region, from which no semiconductor device is obtained, on the interposer 5.

Further, the recognition pattern 10 is designed near the semiconductor element 1 mounted on the interposer 5. Therefore, even when a mount position of the semiconductor element 1 is deviated to some extent, verification of a distance between the recognition pattern 10 and a side face of the semiconductor element 1 makes it possible to immediately correct positional deviation of the semiconductor element 1.

With these advantages, it is possible to maintain or improve accuracy of mounting the semiconductor element 1 on the interposer 5. As a result, it is possible to embody a semiconductor device further reduced in size. In addition, the recognition pattern 10 is designed on a region surrounded by a pattern of the electrodes 2; therefore, it is possible to increase, in number, semiconductor devices to be obtained from one substrate as much as possible irrespective of the region having the recognition pattern 10 designed thereon. Thus, it is possible to manufacture a semiconductor device at low cost.

Second Embodiment

Next, description will be given of a semiconductor device according to a second embodiment of the present invention.

Figure 2:
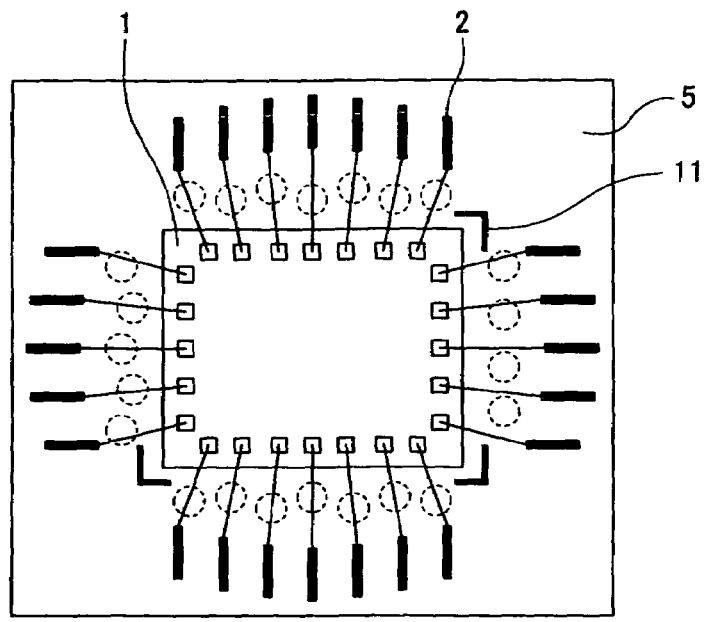
FIG. 2 illustrates a structure of a semiconductor device according to a second embodiment of the present invention.

FIG. 2 illustrates a structure of the semiconductor device according to the second embodiment. As illustrated in FIG. 2, the semiconductor device according to the second embodiment has a feature in that "L"-shaped recognition patterns 11 are designed on corners of a region surrounded by electrodes 2 arranged on an interposer 5 in four directions.

The "L"-shaped recognition pattern 11 is different in shape from the electrode 2 and, therefore, is readily recognized. Further, as illustrated in FIG. 2, lines are drawn in X and Y directions as the "L"-shaped recognition pattern 11. Thus, positional deviation of the semiconductor element 1 can be identified quickly, and a distance between a side face of the semiconductor element 1 and the "L"-shaped recognition pattern 11 can be measured readily. As a result, the positional deviation can be corrected with good accuracy.

Third Embodiment

Next, description will be given of a semiconductor device according to a third embodiment of the present invention.

Figure 3:
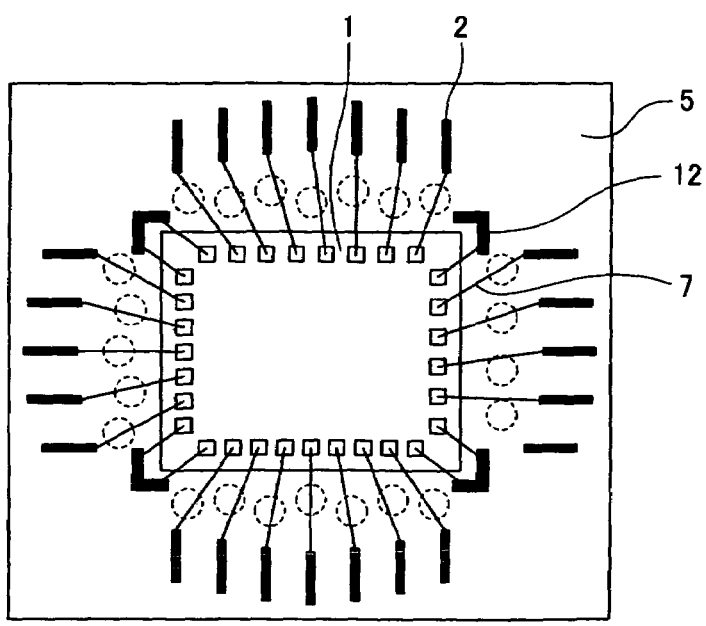
FIG. 3 illustrates a structure of a semiconductor device according to a third embodiment of the present invention.

FIG. 3 illustrates a structure of the semiconductor device according to the third embodiment. As illustrated in FIG. 3, the semiconductor device according to the third embodiment has a feature in that recognition patterns 12 are designed on corners of a region surrounded by electrodes 2 arranged on an interposer 5 in four directions and have a ground function, respectively, and metal nanowires 7 connect between electrodes of a semiconductor element 1 and the electrodes 2 of the interposer 5. In order to further enhance the ground function, a trace width of the recognition pattern 12 is made larger than that of a substrate by two or three times.

As described above, the recognition patterns 12 designed on the corners of the region surrounded by the electrodes 2 arranged on the interposer 5 in four directions have a ground function, respectively. Therefore, it is unnecessary to separately arrange wires each having a ground function on the interposer 5.

Conventionally, plugs connecting wires led out from electrodes to each other in each layer are arranged in a region surrounded by electrodes arranged in four directions. However, according to the third embodiment, there is no arrangement of wires each having a ground function. Thus, it is possible to improve the degree of freedom in designing of a plug arrangement.

Fourth Embodiment

Next, description will be given of a semiconductor device according to a fourth embodiment of the present invention.

Figure 4:
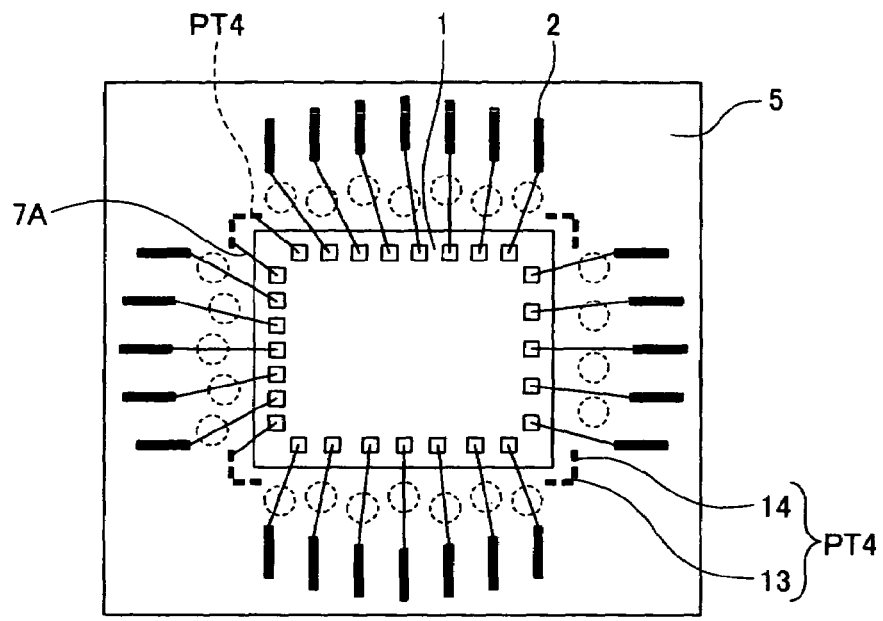
FIG. 4 illustrates a structure of a semiconductor device according to a fourth embodiment of the present invention.

FIG. 4 illustrates a structure of the semiconductor device according to the fourth embodiment. As illustrated in FIG. 4, the semiconductor device according to the fourth embodiment has a feature in that metal nanowires 7A connect between recognition patterns PT4 designed on corners of a region surrounded by electrodes 2 arranged on an interposer 5 in four directions and electrodes, each having a signal function, of a semiconductor element 1. If a plurality of electrodes, each having a signal function, of the semiconductor element 1 are connected to one recognition pattern PT4, as illustrated in FIG. 4, the recognition pattern PT4 is configured to include separation patterns 13 and 14.

As described above, use of the separation patterns 13 and 14 makes it possible to electrically separate a plurality of signal electrodes connected thereto from each other.

Fifth Embodiment

Next, description will be given of a semiconductor device according to a fifth embodiment of the present invention.

Figure 5:
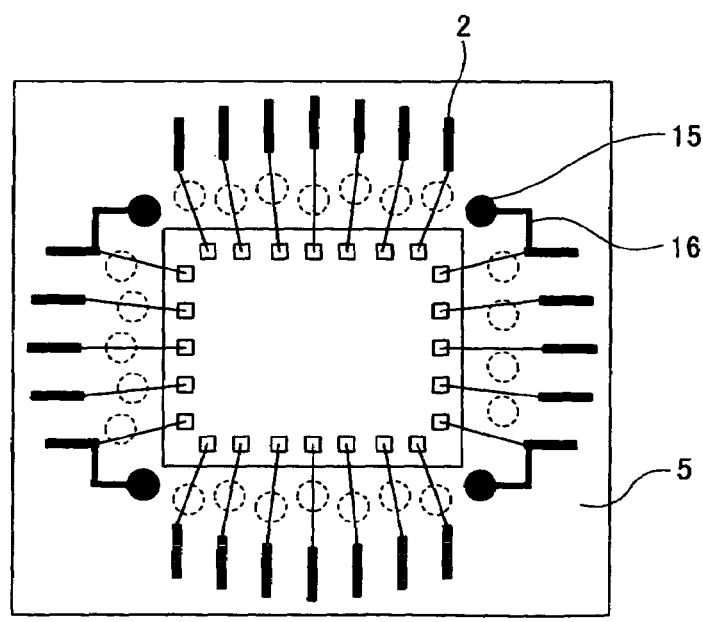
FIG. 5 illustrates a structure of a semiconductor device according to a fifth embodiment of the present invention.

FIG. 5 illustrates a structure of the semiconductor device according to the fifth embodiment. As illustrated in FIG. 5, the semiconductor device according to the fifth embodiment has a feature in that recognition patterns 15 designed on corners of a region surrounded by electrodes 2 arranged on an interposer 5 in four directions function as lands connected to plugs connecting between lead wires 16 of the electrodes 2 of the interposer 5 and wires in each layer.

With the aforementioned configuration, patterns having only a land function are decreased in number; thus, it is possible to improve the degree of freedom in designing of wires in the region surrounded by the electrodes 2 arranged in four directions.

Manufacturing Method

Next, description will be given of a manufacturing method of a semiconductor device according to the present invention.

Figure 6A:
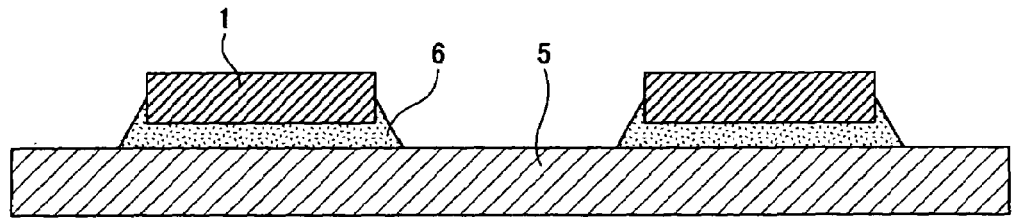
FIG. 6A is a sectional view illustrating a process 1 in a manufacturing method of a semiconductor device according to the present invention.
Figure 6B:
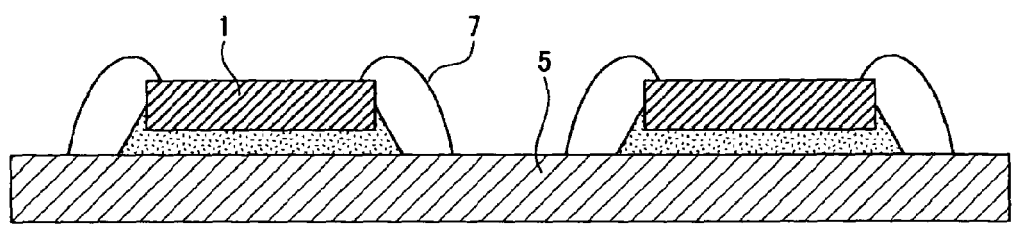
FIG. 6B is a sectional view illustrating a process 2 in the manufacturing method of a semiconductor device according to the present invention.
Figure 6C:
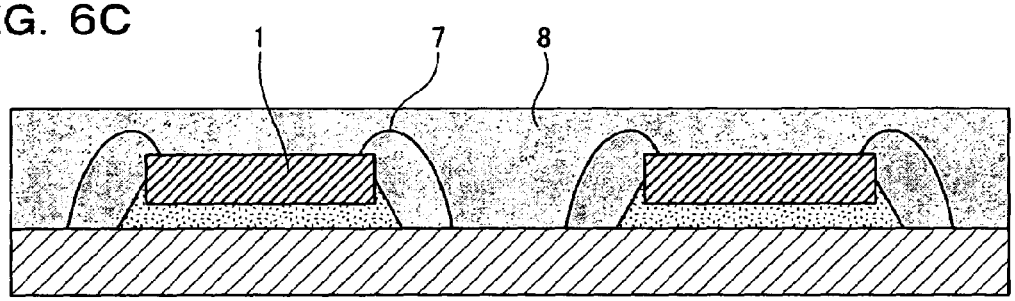
FIG. 6C is a sectional view illustrating a process 3 in the manufacturing method of a semiconductor device according to the present invention.
Figure 6D:
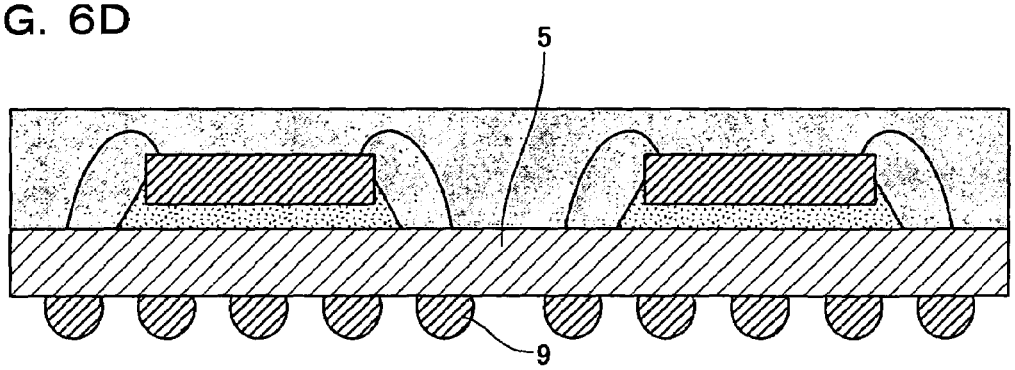
FIG. 6D is a sectional view illustrating a process 4 in the manufacturing method of a semiconductor device according to the present invention.
Figure 6E:
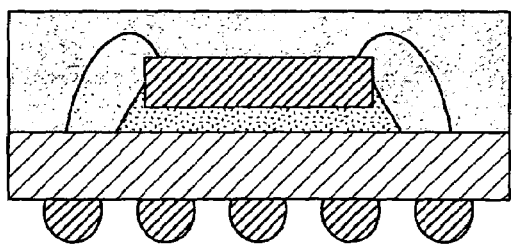
FIG. 6E is a sectional view illustrating a process 5 in the manufacturing method of a semiconductor device according to the present invention.

FIGS. 6A to 6E illustrate a process in the manufacturing method of a semiconductor device according to the present invention, respectively. Specifically, FIG. 6A illustrates a process 1 for mounting a semiconductor element 1 on an interposer 5 in such a manner that the semiconductor element 1 is fixed to the interposer 5 through an adhesive material 6. FIG. 6B illustrates a process 2 for electrically connecting between electrodes of the semiconductor element 1 and electrodes 2 of the interposer 5 through metal nanowires 7. FIG. 6C illustrates a process 3 for sealing a region containing the semiconductor element 1 and the metal nanowires 7 with an insulating material 8. FIG. 6D illustrates a process 4 for mounting metal balls 9 on external electrodes of the interposer 5. FIG. 6E illustrates a process 5 for dicing the interposer 5 into semiconductor devices.

The manufacturing method of a semiconductor device according to the present invention has a feature in that patterns designed on corners of a region surrounded by the electrodes 2 arranged on the interposer 5 in four directions are used as a substrate recognition mark for alignment, respectively, in the process 1 of mounting the semiconductor element 1 on the interposer 5 and the process 2 of connecting between the electrodes of the semiconductor element 1 and the electrodes 2 of the interposer 5 through the metal nanowires 7.

As described above, the patterns designed on the corners of the region surrounded by the electrodes 2 arranged on the interposer 5 in four directions are used as a substrate recognition mark, respectively. As a result, recognition accuracy is improved because the pattern has such a dimension that a recognition apparatus readily recognizes the pattern, so that a position of a semiconductor element to be mounted on an interposer becomes stable. Further, a facility can be prevented from being halted due to erroneous recognition, leading to improvement in productivity.

What is claimed is:

1. A semiconductor device comprising:
a semiconductor element having a plurality of electrodes;
an interposer having electrodes arranged on a top face thereof in four directions and external electrodes arranged on a bottom face thereof with the semiconductor element mounted on the top face thereof;
an adhesive material fixing the semiconductor element to the top face of the interposer;
metal nanowires electrically connecting between the plurality of electrodes of the semiconductor element and the electrodes, arranged in four directions, of the interposer;
an insulating material sealing a region containing the semiconductor element and the metal nanowires; and
metal balls mounted on the external electrodes of the interposer,
wherein at least a pair of patterns, different in shape from the electrodes arranged in four directions, are designed on diagonal corners of a region surrounded by the electrodes arranged on the interposer in four directions, and the at least a pair of patterns is within a region surrounded in four directions by the electrodes.

2. The semiconductor device according to claim 1, wherein the patterns designed on the diagonal corners of the region surrounded by the electrodes arranged on the interposer in four directions are formed in an "L" shape, respectively.

3. The semiconductor device according to claim 1, wherein the patterns designed on the diagonal corners of the region surrounded by the electrodes arranged on the interposer in four directions have a ground function and are electrically connected to the semiconductor element through the metal nanowires, respectively.

4. The semiconductor device according to claim 1, wherein the patterns designed on the diagonal corners of the region surrounded by the electrodes arranged on the interposer in four directions are electrically connected to electrodes, each having a signal function of the semiconductor element, through the metal nanowires.

5. The semiconductor device according to claim 1, wherein the patterns designed on the diagonal corners of the region surrounded by the electrodes arranged on the interposer in four directions are designed to function as lands connected to plugs connecting between wires led out from the electrodes arranged on the interposer in four directions and wires in each layer.

6. A manufacturing method of a semiconductor device, comprising the steps of:
mounting a semiconductor element having a plurality of electrodes on a top face of an interposer having electrodes arranged on the top face thereof in four directions and external electrodes arranged on a bottom face thereof;
electrically connecting between the plurality of electrodes of the semiconductor element and the electrodes arranged in four directions of the interposer, through metal nanowires; sealing a region containing the semiconductor element and the metal nanowires with an insulating material; mounting metal balls on the external electrodes of the interposer; and
dicing, for each semiconductor element, the interposer into semiconductor devices in a state that the semiconductor element is mounted on the top face of the interposer,
wherein in the step of mounting the semiconductor element on the interposer, patterns designed on diagonal corners of a region surrounded by the electrodes arranged on the interposer in four directions are used as recognition marks for recognizing a position on the interposer and used for alignment.

* * * * *